US009412444B2

(12) United States Patent
Yi et al.

(10) Patent No.: US 9,412,444 B2
(45) Date of Patent: Aug. 9, 2016

(54) ELECTRONIC DEVICE

(71) Applicant: SK hynix Inc., Icheon-Si (KR)

(72) Inventors: Jae-Yun Yi, Icheon-Si (KR);
Sung-Woong Chung, Icheon-Si (KR);
Seok-Pyo Song, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 100 days.

(21) Appl. No.: 14/276,968

(22) Filed: May 13, 2014

(65) Prior Publication Data

US 2015/0055397 A1 Feb. 26, 2015

(30) Foreign Application Priority Data

Aug. 20, 2013 (KR) .................. 10-2013-0098655

(51) Int. Cl.
*G11C 11/16* (2006.01)
*G11C 13/00* (2006.01)
*G11C 11/15* (2006.01)

(52) U.S. Cl.
CPC .............. *G11C 13/004* (2013.01); *G11C 11/16* (2013.01); *G11C 11/1673* (2013.01); *G11C 13/0002* (2013.01); *G11C 13/0004* (2013.01); *G11C 13/0007* (2013.01); *G11C 13/0038* (2013.01); *G11C 11/15* (2013.01); *G11C 2013/0042* (2013.01); *G11C 2013/0054* (2013.01)

(58) Field of Classification Search
CPC ......... G11C 11/16; G11C 11/15; H01L 43/08
USPC ....................................................... 365/158
See application file for complete search history.

(56) References Cited

U.S. PATENT DOCUMENTS 8,199,563 B2 6/2012 Chen et al.
2012/0120718 A1* 5/2012 Lou .................. G11C 11/16
365/158

FOREIGN PATENT DOCUMENTS

KR 1020100098957 A 9/2010

* cited by examiner

*Primary Examiner* — Jason Lappas
(74) *Attorney, Agent, or Firm* — Perkins Coie LLP

(57) ABSTRACT

An electronic device including a semiconductor memory. The semiconductor memory includes a bit line; a source line; a plurality of resistive memory cells among which a selected memory cell forms a current path between the bit line and the source line; a read current supply unit configured to supply read current to the bit line in a read operation; a sense amplifier configured to generate read data in response to a voltage level of the bit line in the read operation; and a variable switch element configured to flow current from the source line to a ground terminal in the read operation, and be decreased in its resistance value as a voltage level of the source line is high.

7 Claims, 7 Drawing Sheets

ELECTRONIC DEVICE

CROSS-REFERENCE TO RELATED APPLICATIONS

The present application claims priority of Korean Patent Application No. 10-2013-0098655, entitled "ELECTRONIC DEVICE" and filed on Aug. 20, 2013, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research and development for such semiconductor devices have been conducted. Examples of such semiconductor devices include semiconductor devices which can store data using a characteristic that switched between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which an electronic device capable of reading the logic value of stored data with a large margin is provided.

In one aspect, an electronic device is provided to include a semiconductor memory that includes: a bit line; a source line; a plurality of resistive memory cells among which a selected memory cell forms a current path between the bit line and the source line; a read current supply unit configured to supply read current to the bit line in a read operation; a sense amplifier configured to generate read data in response to a voltage level of the bit line in the read operation; and a variable switch element configured to flow current from the source line to a ground terminal in the read operation, and be decreased in its resistance value as a voltage level of the source line is high.

In another aspect, an electronic device is provided to include a semiconductor memory that includes: a bit line; a source line; a plurality of resistive memory cells coupled to the bit line and the source line in a way that enables a memory cell to be selected to form a current path between the bit line and the source line; a read current supply unit coupled to the bit line and configured to supply a read current to the bit line in a read operation of a selected memory cell; a sense amplifier coupled to the bit line to sense a voltage level in the read operation and configured to generate read data in response to the sensed voltage level of the bit line; and a variable switch element coupled between the source line and an electrical ground and configured to flow a current from the source line to the electrical ground in the read operation, and to exhibit a decreased resistance value as a voltage level of the source line is high.

In some implementations, the variable switch element may include a PMOS transistor.

In some implementations, each of the plurality of resistive memory cells may include: a variable resistance element of which resistance value changes according to a logic value of data stored therein; and a switch element configured to form a current path through the variable resistance element between the bit line and the source line.

In some implementations, the semiconductor memory may further include: a write current supply unit configured to supply write current to either the bit line or the source line according to a logic value of data to be written in a write operation; a first NMOS transistor configured to flow current from the bit line to the ground terminal when write data has a first logic value in the write operation; and a second NMOS transistor configured to flow current from the source line to the ground terminal when write data has a second logic value in the write operation. In some implementations, the semiconductor memory may further include: a write current supply unit configured to supply write current to either the bit line or the source line according to a logic value of data to be written in a write operation.

In some implementations, the sense amplifier may generate the read data by comparing levels of a voltage of the bit line and a reference voltage.

In some implementations, the variable switch element may have a high resistance value when the voltage level of the source line is low.

In some implementations, the electronic device may further include a microprocessor which includes: a control unit that is configured to receive a signal including a command from an outside of the microprocessor, and performs extracting, decoding of the command, or controlling input or output of a signal of microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit is part of the memory unit in the microprocessor.

In some implementations, the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit is part of the cache memory unit in the processor.

In some implementations, the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit is part of the auxiliary memory device or the main memory device in the processing system.

In some implementations, the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit is part of the storage device or the temporary storage device in the data storage system.

In some implementations, the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit is part of the memory or the buffer memory in the memory system.

In another aspect, an electronic device is provided to include a semiconductor memory that includes: a variable resistance of which resistance value changes according to a logic value of data stored therein; and a variable switch element configured to electrically ground one end of the variable resistance element in a read operation for reading data stored in the variable resistance element, and be decreased in its resistance value as a voltage level of the one end is high.

In another aspect, an electronic device is provided to include a semiconductor memory that includes: a variable resistance element of which resistance value changes according to a logic value of data stored therein; and a variable switch element coupled between the variable resistance element and an electrical ground of the device and configured to electrically ground one end of the variable resistance element in a read operation for reading data stored in the variable resistance element, and have different resistance values depending on the resistance value of the variable resistance element.

In some implementations, the variable switch element may include a PMOS transistor.

In some implementations, the semiconductor memory may further include: a first NMOS transistor configured to electrically ground the one end of the variable resistance element in a write operation for writing first data in the variable resistance element; and a second NMOS transistor configured to electrically ground the other end of the variable resistance element in a write operation for writing second data in the variable resistance element.

In some implementations, the semiconductor memory may further include: a read current supply unit configured to supply read current to the other end of the variable resistance element in the read operation; and a sense amplifier configured to generate read data using a voltage level of the other end of the variable resistance element in the read operation.

In some implementations, the electronic device may further include a microprocessor which includes: a control unit that is configured to receive a signal including a command from an outside of the microprocessor, and performs extracting, decoding of the command, or controlling input or output of a signal of microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit is part of the memory unit in the microprocessor.

In some implementations, the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit is part of the cache memory unit in the processor.

In some implementations, the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit is part of the auxiliary memory device or the main memory device in the processing system.

In some implementations, the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit is part of the storage device or the temporary storage device in the data storage system.

In some implementations, the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit is part of the memory or the buffer memory in the memory system.

In another aspect, a method for operating memory cells of an electronic device is provided. The method includes: providing a plurality of memory cells coupled between a bit line and a source line and coupled to a plurality of word lines, respectively, each memory cell including a variable resistance element having two different states for storing data therein and coupled to a corresponding word line that is activated to select a memory cell coupled thereto; coupling the source line to a first terminal of a variable switch element which has a second terminal coupled to an electrical ground of the device to form a current path to provide a read current flowing through a selected memory cell such that the resistance value of the variable switch element increases when the variable resistance element in the selected memory cell has a high resistance value and a resistance value of the variable switch element decreases when the variable resistance element in the selected memory cell has a low resistance value; and comparing a voltage applied at the bit line with a reference voltage to discriminate data stored in the variable resistance element of the selected memory cell.

In some implementations, wherein the ratio of a total resistance including the variable resistance element in the selected memory cell and the variable switch element when the variable resistance element may have high resistance state to the total resistance when the variable resistance element has low resistance state is greater than the same ratio when the source line is not coupled to the variable switch element.

In some implementations, the method may further include: selecting a memory cell in which data is to be written; and providing a write current either to the bit line or to the source line depending on logic value of the data to be written.

In another aspect an electronic device is provided to include a semiconductor memory that includes: a bit line; a source line; a plurality of word lines; a plurality of resistive memory cells, each resistive memory cell connected to the source line, the bit line and a corresponding word line, wherein a word line among the plurality of word lines is activated to select a resistive memory cell; a read current supply unit coupled to the bit line to supply a read current to the bit line in a read operation; and a variable switch element having a terminal connected to the source line and forming a current path in the read operation that flows from the bit line to the source line through the selected resistive memory cell, wherein the variable switch element has a resistance value that changes with a voltage level of the source line.

In some implementations, the variable switch element may include a PMOS transistor.

In some implementations, each of the plurality of resistive memory cells may include: a variable resistance element of which resistance value changes according to a logic value of data stored therein; and a switch element configured to form a current path through the variable resistance element between the bit line and the source line.

In some implementations, the semiconductor memory may further comprise: a write current supply unit configured to supply write current to either the bit line or the source line according to a logic value of data to be written in a write operation.

In some implementations, the sense amplifier may generate the read data by comparing levels of a voltage of the bit line and a reference voltage.

In some implementations, the variable switch element may have high resistance value when the voltage level of the source line is low and has low resistance value when the voltage level of the source line is high.

Those and other aspects of the disclosed technology and their implementations and variations are described in greater detail in the drawings, the description and the claims.

DETAILED DESCRIPTION

Various examples and implementations of the disclosed technology are described below in detail with reference to the accompanying drawings.

A semiconductor device in accordance with implementations of the present disclosure may include a variable resistance element. In the following descriptions, a variable resistance element may exhibit a resistance variable characteristic and may include a single layer or a multi-layer. For example, a variable resistance element may include substances used in an RRAM, a PRAM, an MRAM, an FRAM, and so forth, for example, a chalcogenide-based compound, a transition metal compound, a ferroelectric, a ferromagnetic, and so forth. However, the present disclosure is not limited to these substances, and it is sufficient for a variable resistance element to have a resistance variable characteristic that it is switched between different resistant states according to voltages or currents applied to both ends thereof.

In detail, a variable resistance element may include a metal oxide. For example, the metal oxide may be a transition metal oxide such as a nickel (Ni) oxide, a titanium (Ti) oxide, a hafnium (Hf) oxide, a zirconium (Zr) oxide, a tungsten (W) oxide and a cobalt (Co) oxide or a perovskite-based substance such as STO (SrTiO) and PCMO (PrCaMnO). Such a variable resistance element may exhibit a characteristic that it is switched between different resistant states due to creation and extinction of current filaments through behavior of vacancies.

Also, a variable resistance element may include a phase change substance. For example, the phase change substance may be a chalcogenide-based substance such as GST (Ge—Sb—Te). This variable resistance element may exhibit a characteristic that it is switched between different resistant states by being stabilized in a crystalline state and an amorphous state by heat.

Further, a variable resistance element may include a structure in which a tunneling barrier layer is interposed between two ferromagnetic layers. The ferromagnetic layers may be formed using a substance such as NiFeCo and CoFe, and the tunneling barrier layer may be formed using a substance such as Al2O3. The variable resistance element may exhibit a characteristic that it is switched between different resistant states according to magnetization directions of the ferromagnetic layers. For example, in the case where the magnetization directions of the two ferromagnetic layers are parallel to each other, the variable resistance element may be in a low resistant state, and, in the case where the magnetization directions of the two ferromagnetic layers are anti-parallel to each other, the variable resistance element may be in a high resistant state.

Figure 1:
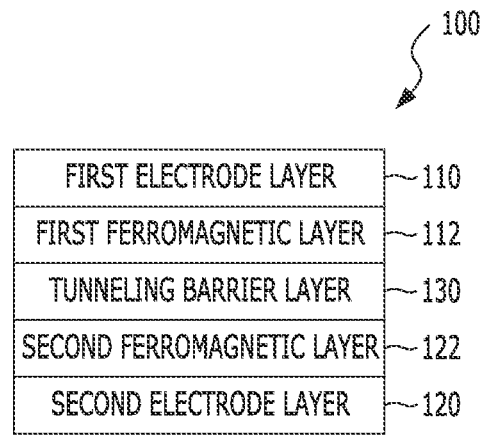
FIG. 1 is a diagram showing an example of a magnetic tunnel junction (MTJ) element including a tunneling barrier layer interposed between two ferromagnetic layers.

FIG. 1 is a diagram showing an example of a magnetic tunnel junction (MTJ) element including a tunneling barrier layer interposed between two ferromagnetic layers.

Referring to FIG. 1, an MTJ element 100 includes a first electrode layer 110 as a top electrode, a second electrode layer 120 as a bottom electrode, a first ferromagnetic layer 112 and a second ferromagnetic layer 122 as a pair of ferromagnetic layers, and a tunneling barrier layer 130 which is formed between the pair of the first and second ferromagnetic layers 112 and 122.

The first ferromagnetic layer 112 may be a free ferromagnetic layer of which magnetization direction may be changed according to a direction of current applied to the MTJ element 100, and the second ferromagnetic layer 122 may be a pinned ferromagnetic layer of which magnetization direction is pinned.

The MTJ element 100 operates to store data "0" or "1" as the resistance value is changed to a low value or high value, respectively, according to a direction of the current.

Figure 2A:
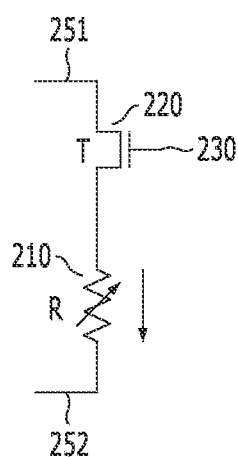
FIGS. 2A and 2B are diagrams explaining a principle of storing data in a variable resistance element.
Figure 2B:
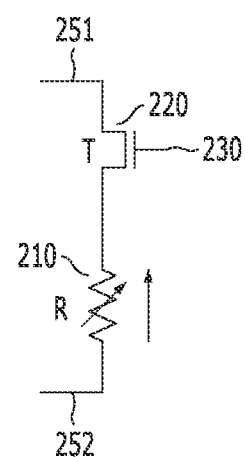

FIGS. 2A and 2B are diagrams of two examples of circuit operation configurations where a variable resistance element 210 exhibits two different resistance values for explaining a principle of storing data in a variable resistance element 210. The variable resistance element 210 exhibits two different resistance values when the current is directed in two opposite directions and may include the MTJ element 100 described with reference to FIG. 1 to achieve this property.

FIG. 2A is a diagram explaining a principle of recording data of a low logic value in the variable resistance element 210. In order to select the variable resistance element 210 for storing data, a word line 230 coupled to the variable resistance element 210 is activated to turn on a transistor 220. As a current flows from one end 251 to the other end 252 (in the direction indicated by the arrow), that is, from the first electrode layer 110 as a top electrode to the second electrode layer 120 as a bottom electrode in the MTJ element 100 shown in FIG. 1, the magnetization direction of the first ferromagnetic layer 112 as a free ferromagnetic layer and the magnetization direction of the second ferromagnetic layer 122 as a pinned ferromagnetic layer become parallel to each other, and the variable resistance element 210 is in a low resistant state. When the variable resistance element 210 is in the low resistant state, it is defined that 'low' data is stored in the variable resistance element 210.

FIG. 2B is a diagram explaining a principle of recording data of a high logic value in the variable resistance element 210. In a similar manner, the word line 230 coupled to the variable resistance element 210 is activated to turn on the transistor 220. As current flows from the other end 252 to one end 251 (in the direction indicated by the arrow), that is, from the second electrode layer 120 to the first electrode layer 110 in the MTJ element 100 shown in FIG. 1, the magnetization direction of the first ferromagnetic layer 112 and the magnetization direction of the second ferromagnetic layer 122 become anti-parallel to each other, and the variable resistance element 210 is in a high resistant state. When the variable resistance element 210 is in the high resistant state, it is defined that 'high' data is stored in the variable resistance element 210.

The logic value of the data stored in the variable resistance element 210 is changed according to the resistance value of the variable resistance element 210. In the case where there exists a large difference in the resistance values between the high resistant state and the low resistant state, it is easy to discriminate the data stored in the variable resistance element 210 by discriminating two different logic states with a high accuracy based on the two significantly different resistance values. In the case where there exists a small difference in the resistance values between the high resistant state and the low resistant state, it is difficult to discriminate the data stored in the variable resistance element 210, because an error is more or highly likely to occur during the data determination when the two different resistance values are not significantly different from each other. Therefore, there is a demand or need for a technique capable of precisely discriminating the data stored in a variable resistance element even when there exists a small difference in the resistance values between the high resistance state and the low resistance state of the variable resistance element.

Figure 3:
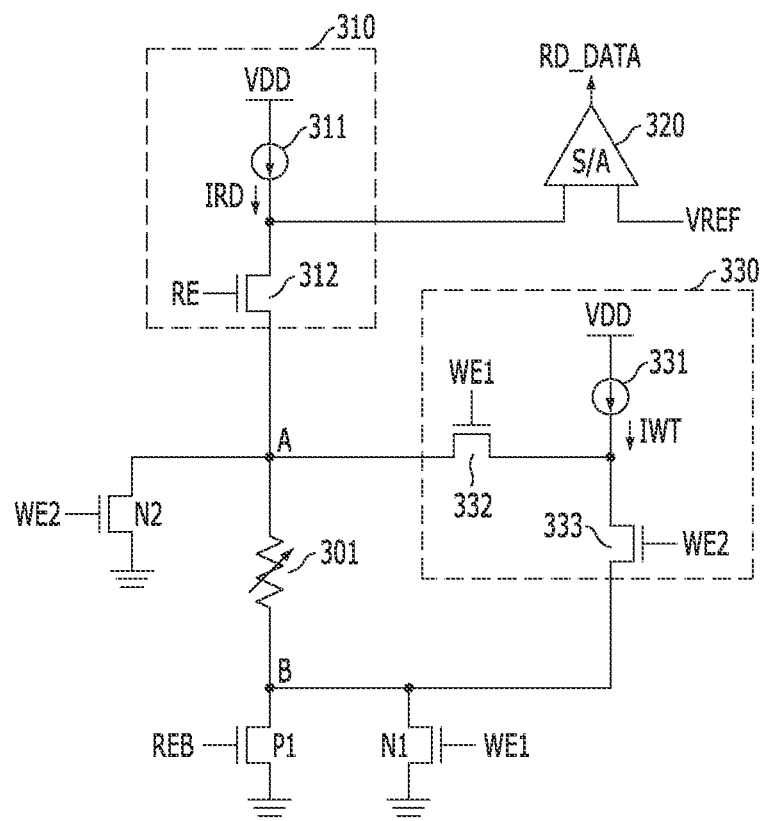
FIG. 3 is an exemplary configuration diagram of a memory circuit or device including a variable resistance element.
Figure 4:
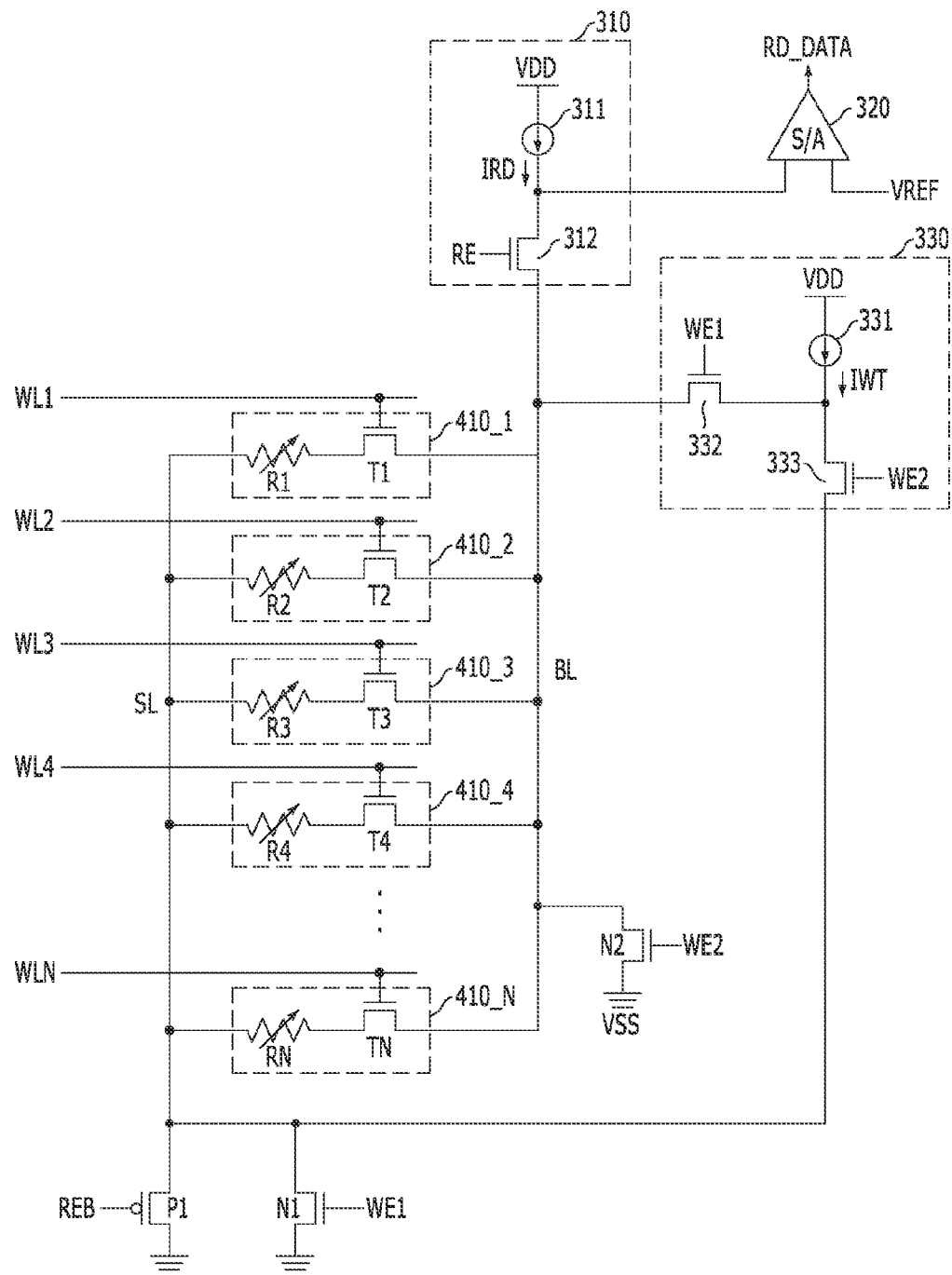
FIG. 4 is an exemplary configuration diagram of a memory circuit or device that includes memory cells each including a variable resistance element.

FIGS. 3 and 4 show implementations of a memory circuit or device having a variable resistance element as described above.

FIG. 3 is an exemplary configuration diagram of a memory circuit or device including a variable resistance element. In FIG. 3, a principle for discriminating the data stored in a variable resistance element 301 with a small error is explained.

Referring to FIG. 3, a memory circuit may include a variable resistance element 301, a PMOS transistor P1, NMOS transistors N1 and N2, a read current supply unit 310, a sense amplifier 320, and a write current supply unit 330.

The variable resistance element 301 may be an element which can change its resistance value to a particular resistance value according to a specific logic value of the data stored therein. For example, the variable resistance element 301 may have a low resistance state when low data is stored in the variable resistance element 301, and may have a high resistance state when high data is stored in the variable resistance element 301.

As illustrated in FIG. 3, the variable resistance element 301 is shown as a two-terminal device having A and B ends. The PMOS transistor P1 is coupled to the B end of the variable resistance element 301 and may electrically ground one end B of the variable resistance element 301 in a read operation. The first NMOS transistor N1 is coupled to the B end of the variable resistance element 301 and the second NMOS transistor N2 is coupled to the A end of the variable resistance element 301. In a write operation, the first NMOS transistor N1 may be operated to electrically ground the one end B, or the second NMOS transistor N2 may be operated to ground the other end A of the resistance variable element 301.

The read current supply unit 310 may be configured to supply a current to the end A of the variable resistance element 301 in the read operation for discriminating the data stored in the variable resistance element 301. The read current supply unit 310 may include a current source 311 for supplying read current $I_{RD}$, and an NMOS transistor 312 for transferring the read current $I_{RD}$ to the end A of the variable resistance element 301.

During the read operation, the sense amplifier 320 may be configured to generate read data RD_DATA using the voltage level of the end A of the variable resistance element 301 and a reference voltage VREF. The sense amplifier 320 may generate the read data RD_DATA with a high level when the voltage level of the end A is higher than the reference voltage VREF, and may generate the read data RD_DATA at a low level when the voltage level of the end A is lower than the reference voltage VREF.

During the write operation, the write current supply unit 330 may be configured to supply write current $I_{WT}$ to either the end A or the end B of the variable resistance element 301. The write current supply unit 330 may include a current source 331 for supplying the write current $I_{WT}$ and NMOS transistors 332 and 333 for transferring the write current $I_{WT}$ to the end A or the end B of the variable resistance element 301. The write current supply unit 330 transfers the write current $I_{WT}$ to the end A or the end B depending on the logic value of data to be written in the variable resistance element 301.

Herein below, descriptions will be separately made for read and write operations.

(1) An Operation for Writing Low Data in the Variable Resistance Element 301

In this case, a first write signal WE1 is activated to a high level to turn on the transistors 332 and the first NMOS transistor N1 and a second write signal WE2 and a read signal RE are deactivated to low levels to turn off the transistors 312 and 333, the PMOS transistor P1, and the second NMOS transistor N2. The write current $I_{WT}$ of the current source 331 is supplied to the end A of the variable resistance element 301, and the end B of the variable resistance element 301 is grounded. Therefore, the write current $I_{WT}$ flows in a direction from the end A to the end B of the variable resistance element 301. Accordingly, the variable resistance element 301 may have the low resistance state in which low data is stored therein.

(2) An Operation for Writing High Data in the Variable Resistance Element 301

In this case, the second write signal WE2 is activated to a high level to turn on the transistor 333 and the second NMOS transistor N2, and the first write signal WE1 and the read signal RE are deactivated to low levels to turn off the transistors 312 and 332, the PMOS transistor P1, and the first NMOS transistor N1. The write current $I_{WT}$ of the current source 331 is supplied to the end B of the variable resistance element 301, and the end A of the variable resistance element 301 is grounded. That is to say, the write current $I_{wT}$ flows in a direction from the end B to the end A of the variable resistance element 301. Therefore, the variable resistance element 301 may have the high resistance state in which high data is stored therein.

(3) An Operation for Reading the Data Stored in the Variable Resistance Element 301

In this case, as the read signal RE is activated to a high level and an inverted read signal REB is activated to a low level, the transistor 312 and the PMOS transistor P1 may be turned on, and as the first write signal WE1 and the second write signal WE2 are deactivated to the low levels, the transistors 332 and 333, the first NMOS transistor N1 and the second NMOS transistor N2 may be turned off. The read current $I_{RD}$ of the current source 311 may be supplied to the end A of the variable resistance element 301, and the end B of the variable resistance element 301 may be grounded by the PMOS transistor P1. Therefore, the end A of the variable resistance element 301 may have a high voltage level when the variable resistance element 301 has a high resistance value, and may have a low voltage level when the variable resistance element 301 has a low resistance value. The sense amplifier 320 may compare the voltage level of the end A of the variable resistance element 301 with the reference voltage VREF, and may generate the read data RD_DATA.

In the read operation, the grounding of the end B of the variable resistance element 301 through the PMOS transistor P1 may allow the sense amplifier 320 to easily perform the comparison by increasing the ratio of high resistance/low resistance that is sensed by the sense amplifier 320. In the case where the variable resistance element 301 has the high resistance value, since a voltage drop by the variable resistance element 301 increases, the voltage level of the end B becomes relatively low. This affects the VGS value between a gate and a source of the PMOS transistor P1 such that it is difficult for the PMOS transistor P1 to be turned on, providing a condition that the resistance value of the PMOS transistor P1 increases. Conversely, in the case where the variable resistance element 301 has the low resistance value, since a voltage drop by the variable resistance element 301 decreases, the voltage level of the end B becomes relatively high. This affects the VGS value of the PMOS transistor P1 such that the PMOS transistor P1 is easily turned on, providing a condition that the resistance value of the PMOS transistor P1 decreases. In this manner, when the variable resistance element 301 has the high resistance value, the resistance value of the PMOS transistor P1 increases, and when the variable resistance element 301 has the low resistance value, the resistance value of the PMOS transistor P1 decreases. Thus, the operation accuracy of the sense amplifier 320 increases in the memory circuit or device.

The ratio of high resistance/low resistance (H/L ratio) that is sensed by the sense amplifier 320 is expressed as in the following Equation 1 when the PMOS transistor P1 is not present.

$$H/L\ \text{ratio(without}\ P1) = High\_R\_301/Low\_R\_301 \quad \text{[Equation 1]}$$

wherein High_R_301 is the high resistance value of the variable resistance element 301 and Low_R_301 is the low resistance value of the variable resistance element 301.

The ratio of high resistance/low resistance that is sensed by the sense amplifier 320 is expressed in the Equation 2 when the PMOS transistor P1 is present.

$$H/L\ \text{ratio(with}\ P1) = (High\_R\_301 + High\_R\_P1)/(Low\_R\_301 + Low\_R\_P1) \quad \text{[Equation 2]}$$

wherein High_R_P1 is the high resistance value of the PMOS transistor P1 and Low_R_P1 is the low resistance value of the PMOS transistor P1.

By comparing Equation 1 and Equation 2, it may be seen that the ratio of high resistance/low resistance that is sensed by the sense amplifier 320 may be increased by grounding the variable resistance element 301 using the PMOS transistor P1 in the read operation. If the ratio of high resistance/low resistance increases, the sensing margin of the sense amplifier 320 increases, and the accuracy of the read operation may be improved. While it is exemplified in FIG. 3 that the PMOS transistor P1 is used as an element for grounding the variable resistance element 301 in the read operation, other elements of which resistance values decrease as the voltage level of the one end B is high can be used instead of the PMOS transistor P1.

FIG. 4 is another exemplary configuration diagram of a memory circuit or device including a variable resistance element. FIG. 4 shows an example in which a plurality of variable resistance elements are arranged in the form of an array.

Referring to FIG. 4, a memory circuit may include a bit line BL, a source line SL, resistive memory cells 410_1 to 410_N, a read current supply unit 310, a sense amplifier 320, a write current supply unit 330, a PMOS transistor P1, and NMOS transistors N1 and N2.

The resistive memory cells 410_1 to 410_N are arranged between the bit line BL and the source line SL. The respective resistive memory cells 410_1 to 410_N include variable resistance elements R1 to RN and switch elements T1 to TN. Each of the variable resistance elements R1 to RN has a characteristic that the resistance value changes according to the logic value of the data stored therein. For example, the variable resistance element 301 may have a low resistant state when low data is stored therein and may have a high resistant state when high data is stored therein. The switch elements T1 to TN may form current paths through the variable resistance elements R1 to RN between the bit line BL and the source line SL. The switch elements T1 to TN may be turned on and off by the control of word lines WL1 to WLN. One word line among the word lines WL1 to WLN may be activated in a read operation or a write operation, and a memory cell corresponding to the activated word line among the memory cells 410_1 to 410_N may be electrically coupled to the bit line BL and the source line SL. The memory cell corresponding to the activated word line is referred to as a selected memory cell.

During the read operation, the read current supply unit 310 may be configured to supply read current $I_{RD}$ to the bit line BL for discriminating the data stored in the selected memory cell among the memory cells 410_1 to 410_N. The read current supply unit 310 may include a current source 311 for supplying the read current $I_{RD}$ and an NMOS transistor 312 for transferring the read current $I_{RD}$ to the bit line BL.

The sense amplifier 320 may be configured to generate read data RD_DATA using the voltage level of the bit line BL and a reference voltage VREF in the read operation. The sense amplifier 320 may generate the read data RD_DATA with a high level when the voltage level of the bit line BL transferred through the NMOS transistor 312 is higher than the reference voltage VREF, and may generate the read data RD_DATA with a low level when the voltage level of the bit line BL transferred through the NMOS transistor 312 is not higher than the reference voltage VREF.

The write current supply unit 330 may be configured to supply write current $I_{WT}$ to the source line SL or the bit line BL in the write operation. The write current supply unit 330 may include a current source 331 for supplying the write current $I_{WT}$ and NMOS transistors 332 and 333 for transferring the write current $I_{WT}$ to the bit line BL or the source line SL. To which line between the source line SL and the bit line BL the write current supply unit 330 transfers the write current $I_{WT}$ may be determined according to the logic value of data to be written in the selected memory cell.

In the memory circuit of FIG. 4, operations for writing and reading data may be performed in the same manner as in the memory circuit of FIG. 3. However, the memory circuit of FIG. 4 is different from the memory circuit of FIG. 3 in that data is written in and read from a resistive memory element in the selected memory cell among the plurality of memory cells 410_1 to 410_N. In FIG. 4, since the one end of the source line SL of the selected resistive memory element is grounded by the PMOS transistor P1 in the read operation, the ratio of high resistance/low resistance that is sensed by the sense amplifier 320 may be expressed as Equation 2. Namely, by grounding the one end of the resistive memory element as a target of the read operation by the PMOS transistors P1, the sensing margin of the sense amplifier 320 may be increased, and the accuracy of the read operation may be improved.

While it is exemplified in FIG. 4 that the memory cells 410_1 to 410_N are disposed in one column formed by the pair of the bit line and the source and in a plurality of rows formed by a plurality of word line, it is to be noted as a matter of course that memory cells may be disposed in several tens to several hundreds of rows and several tens to several hundreds of columns. Also, it is to be noted that switch elements may be added to select one or more of the plurality of columns.

As is apparent from the above descriptions, according to the electronic device in accordance with the above implementations, it is possible to read the logic value of stored data with a large margin.

The above and other memory circuits or semiconductor devices based on the disclosed technology can be used in a range of devices or systems. FIGS. 5-9 provide some examples of devices or systems that can implement the memory circuits disclosed herein.

Figure 5:
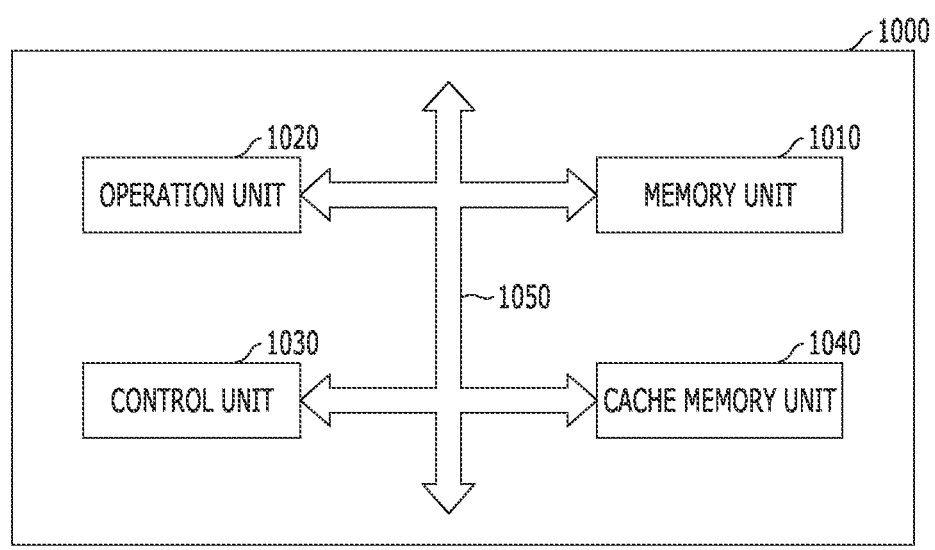
FIG. 5 shows an example of a configuration diagram of a microprocessor implementing memory circuitry based on the disclosed technology.

FIG. 5 shows an example of a configuration diagram of a microprocessor based on another implementation of the disclosed technology.

Referring to FIG. 5, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and an address where data for performing of the operations are stored.

The memory unit 1010 may include one or more of the above-described memory circuits in accordance with the implementations. For example, the memory unit 1010 implementation may include a bit line, a source line, a plurality of resistive memory cells among which a selected memory cell forms a current path between the bit line and the source line, a read current supply unit configured to supply read current to the bit line in a read operation, a sense amplifier configured to generate read data in response to a voltage level of the bit line in the read operation, and a variable switch element configured to flow current from the source line to a ground terminal in the read operation, and be decreased in its resistance value as a voltage level of the source line is high. Since it is possible to read the logic value of stored data with a large margin, a read operation may be performed with stability. Through this, the operating precision of the memory unit 1010 may be improved. Since the memory unit 1010 according to the present implementation may be improved in operating precision, the microprocessor 1000 may be improved in performance.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands and controlling input and output of signals of the microprocessor, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 6:
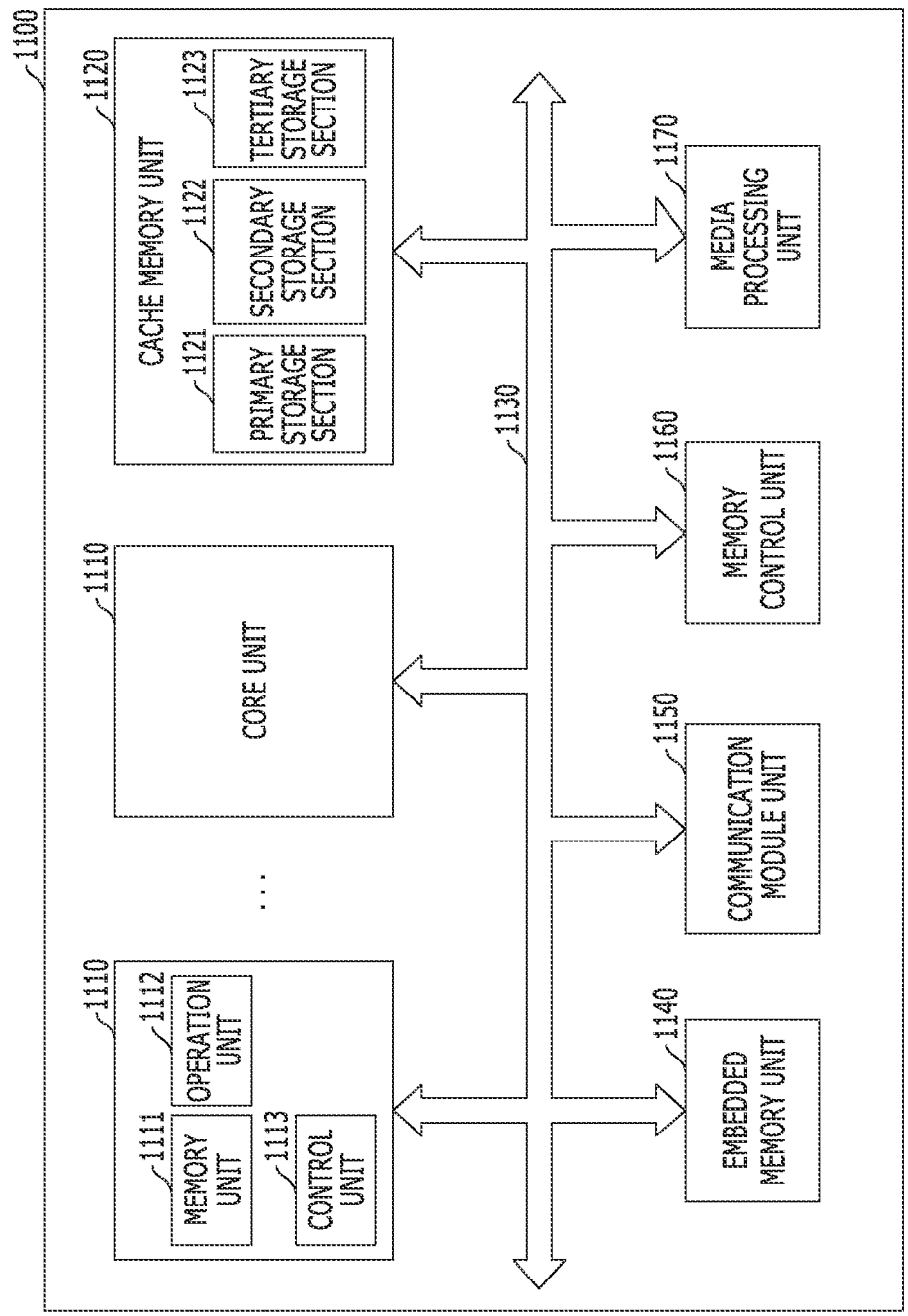
FIG. 6 shows an example of a configuration diagram of a processor implementing memory circuitry based on the disclosed technology.

FIG. 6 is a configuration diagram of a processor based on another implementation of the disclosed technology.

Referring to FIG. 6, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and an address where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage unit 1121, a secondary storage unit 1122 and a tertiary storage unit 1123. In general, the cache memory unit 1120 includes the primary and secondary storage units 1121 and 1122, and may include the tertiary storage unit 1123 in the case where high storage capacity is required. As the occasion demands, the cache memory unit 1120 may include an increased number of storage units. That is to say, the number of storage units which are included in the cache memory unit 1120 may be changed according to a design. The speeds at which the primary, secondary and tertiary storage units 1121, 1122 and 1123 store and discriminate data may be the same or different. In the case where the speeds of the respective storage units 1121, 1122 and 1123 are different, the speed of the primary storage unit 1121 may be largest. At least one storage unit of the primary storage unit 1121, the secondary storage unit 1122 and the tertiary storage unit 1123 of the cache memory unit 1120 may include one or more of the above-described memory circuits in accordance with the implementations. For example, the cache memory unit 1120 implementation may include a bit line, a source line, a plurality of resistive memory cells among which a selected memory cell forms a current path between the bit line and the source line, a read current supply unit configured to supply read current to the bit line in a read operation, a sense amplifier configured to generate read data in response to a voltage level of the bit line in the read operation, and a variable switch element configured to flow current from the source line to a ground terminal in the read operation, and be decreased in its resistance value as a voltage level of the source line is high. Since it is possible to read the logic value of stored data with a large margin, a read operation may be performed with stability. Through this, the operating precision of the cache memory unit 1120 may be improved. Since the cache memory unit 1120 according to the present implementation may be improved in operating precision, the core unit 1110 may be improved in performance.

Although it was shown in FIG. 6 that all the primary, secondary and tertiary storage units 1121, 1122 and 1123 are configured inside the cache memory unit 1120, it is to be noted that all the primary, secondary and tertiary storage units 1121, 1122 and 1123 of the cache memory unit 1120 may be configured outside the core unit 1110 and may compensate for a difference in data processing speed between the core unit 1110 and the external device. Meanwhile, it is to be noted that the primary storage unit 1121 of the cache memory unit 1120 may be disposed inside the core unit 1110 and the secondary storage unit 1122 and the tertiary storage unit 1123 may be configured outside the core unit 1110 to strengthen the function of compensating for a difference in data processing speed. In another implementation, the primary and secondary storage units 1121, 1122 may be disposed inside the core units 1110 and tertiary storage units 1123 may be disposed outside core units 1110. The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage unit 1121 of the cache memory unit 1120 may be configured in each core unit 1110 in correspondence to the number of the plurality of core units 1110, and the secondary storage unit 1122 and the tertiary storage unit 1123 may be configured outside the plurality of core units 1110 in such a way as to be shared through the bus interface 1130. The processing speed of the primary storage unit 1121 may be larger than the processing speeds of the secondary and tertiary storage unit 1122 and 1123. In another implementation, the primary storage unit 1121 and the secondary storage unit 1122 may be configured in each core unit 1110 in correspondence to the number of the plurality of core units 1110, and the tertiary storage unit 1123 may be configured outside the plurality of core units 1110 in such a way as to be shared through the bus interface 1130. The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data prepared in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory) and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), and a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 7:
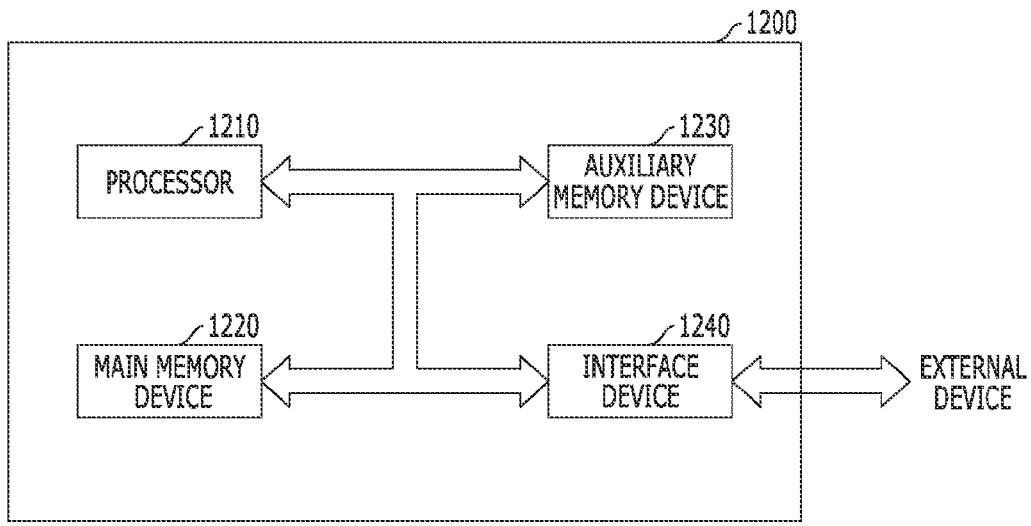
FIG. 7 shows an example of a configuration diagram of a system implementing memory circuitry based on the disclosed technology.

FIG. 7 is a configuration diagram of a system based on another implementation of the disclosed technology.

Referring to FIG. 7, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 decodes inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 implementation may include a bit line, a source line, a plurality of resistive memory cells among which a selected memory cell forms a current path between the bit line and the source line, a read current supply unit configured to supply read current to the bit line in a read operation, a sense amplifier configured to generate read data in response to a voltage level of the bit line in the read operation, and a variable switch element configured to flow current from the source line to a ground terminal in the read operation, and be decreased in its resistance value as a voltage level of the source line is high. Since it is possible to read the logic value of stored data with a large margin, a read operation may be performed with stability. Through this, the operating precision of the main memory device 1220 may be improved. Since the main memory device 1220 according to the present implementation may be improved in operating precision, the system 1200 may be improved in portability and performance.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 implementation may include a bit line, a source line, a plurality of resistive memory cells among which a selected memory cell forms a current path between the bit line and the source line, a read current supply unit configured to supply read current to the bit line in a read operation, a sense amplifier configured to generate read data in response to a voltage level of the bit line in the read operation, and a variable switch element configured to flow current from the source line to a ground terminal in the read operation, and be decreased in its resistance value as a voltage level of the source line is high. Since it is possible to read the logic value of stored data with a large margin, a read operation may be performed with stability. Through this, the operating precision of the auxiliary memory device 1230 may be improved. Since the auxiliary memory device 1230 according to the present implementation may be improved in operating precision, the system 1200 may be improved in performance.

Also, the auxiliary memory device 1230 may further include a data storage system (see the reference numeral 1300 of FIG. 14) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device and so on. The communication device may include a module capable of being connected with a wired network, a module capable of being connected with a wireless network and both of them.

The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 8:
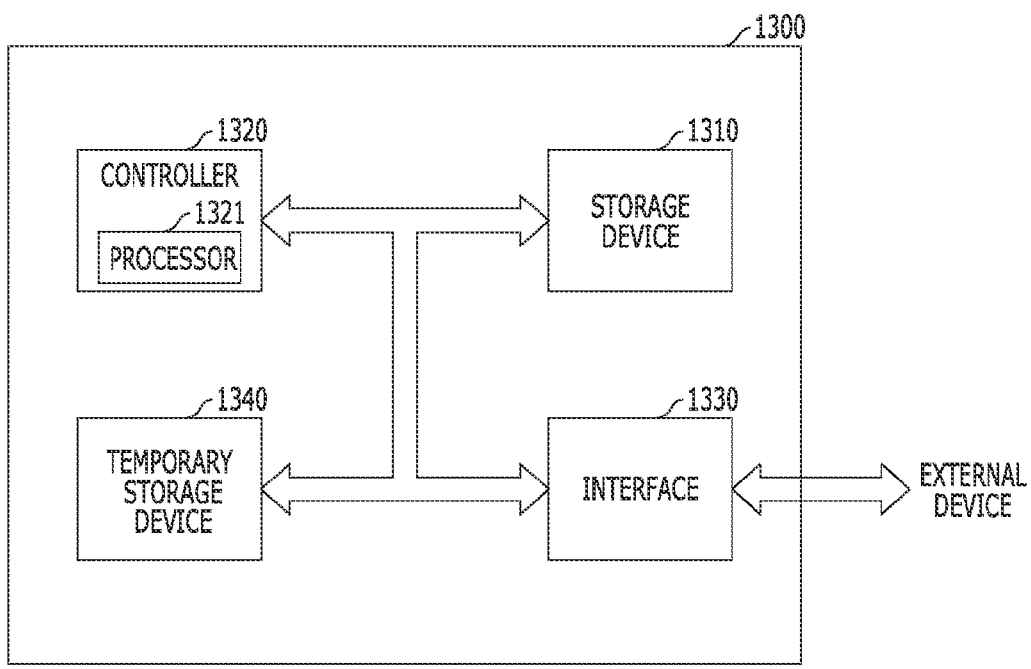
FIG. 8 shows an example of a configuration diagram of a data storage system implementing memory circuitry based on the disclosed technology.

FIG. 8 is a configuration diagram of a data storage system based on another implementation of the disclosed technology.

Referring to FIG. 8, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digi-
tal versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices.

In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other. The temporary storage device 1340 can store data temporarily implementation for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 implementation may include a bit line, a source line, a plurality of resistive memory cells among which a selected memory cell forms a current path between the bit line and the source line, a read current supply unit configured to supply read current to the bit line in a read operation, a sense amplifier configured to generate read data in response to a voltage level of the bit line in the read operation, and a variable switch element configured to flow current from the source line to a ground terminal in the read operation, and be decreased in its resistance value as a voltage level of the source line is high. Since it is possible to read the logic value of stored data with a large margin, a read operation may be performed with stability. Through this, the operating precision of the storage device 1310 or the temporary storage device 1340 may be improved. Since the storage device 1310 or the temporary storage device 1340 according to the present implementation may be improved in operating precision, the data storage system 1300 may be improved in performance.

Figure 9:
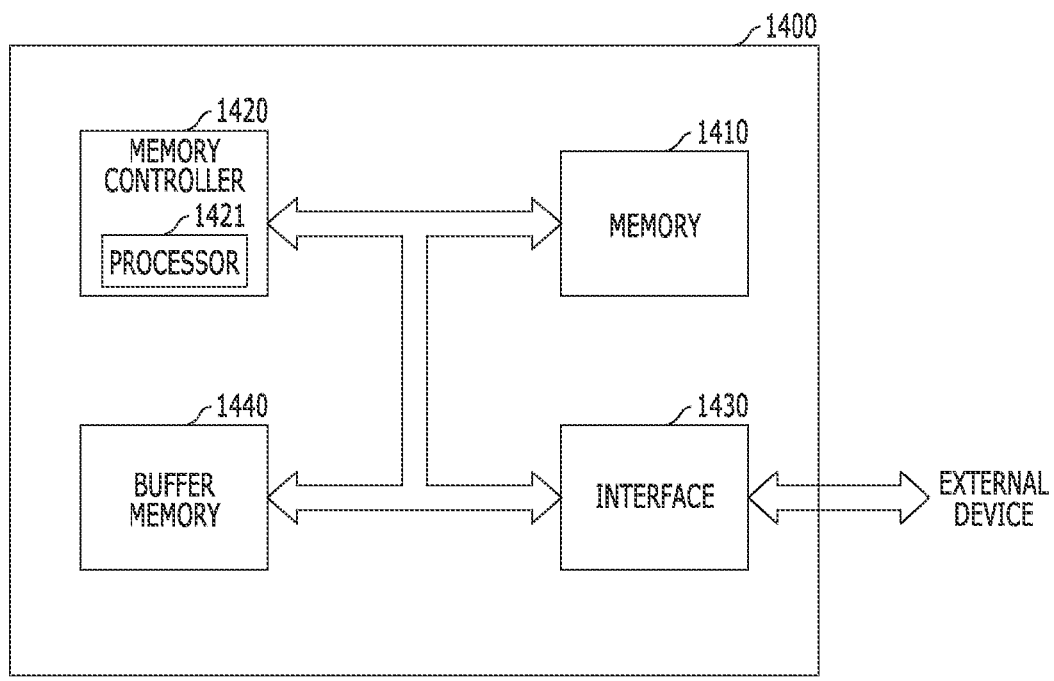
FIG. 9 shows an example of a configuration diagram of a memory system implementing memory circuitry based on the disclosed technology.

FIG. 9 is a configuration diagram of a memory system based on another implementation of the disclosed technology.

Referring to FIG. 9, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 implementation may include a bit line, a source line, a plurality of resistive memory cells among which a selected memory cell forms a current path between the bit line and the source line, a read current supply unit configured to supply read current to the bit line in a read operation, a sense amplifier configured to generate read data in response to a voltage level of the bit line in the read operation, and a variable switch element configured to flow current from the source line to a ground terminal in the read operation, and be decreased in its resistance value as a voltage level of the source line is high. Since it is possible to read the logic value of stored data with a large margin, a read operation may be performed with stability. Through this, the operating precision of the memory 1410 may be improved. Since the memory 1410 according to the present implementation may be improved in operating precision, the memory system 1400 may be improved in performance.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described memory circuits in accordance with the implementations. The buffer memory 1440 implementation may include a bit line, a source line, a plurality of resistive memory cells among which a selected memory cell forms a current path between the bit line and the source line, a read current supply unit configured to supply read current to the bit line in a read operation, a sense amplifier configured to generate read data in response to a voltage level of the bit line in the read operation, and a variable switch element configured to flow current from the source line to a ground terminal in the read operation, and be decreased in its resistance value as a voltage level of the source line is high. Since it is possible to read the logic value of stored data with a large margin, a read operation may be performed with stability. Through this, the operating precision of the buffer memory 1440 may be improved. Since the buffer memory 1440 according to the present implementation may be improved in operating precision, the memory system 1400 may be improved in performance.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 5-9 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device including a semiconductor memory, the semiconductor memory comprising:
   a bit line;
   a source line;
   a plurality of resistive memory cells coupled to the bit line and the source line in a way that enables a memory cell to be selected to form a current path between the bit line and the source line, wherein each resistive memory cell includes a variable resistance element of which resistance value changes according to a logic value of data stored therein and a switch element coupled to the resistive memory cell to form a current path through the variable resistance element between the bit line and the source line;
   a read current supply unit coupled to the bit line and configured to supply a read current to the bit line in a read operation of a selected memory cell;
   a sense amplifier coupled to the bit line to sense a voltage level in the read operation and configured to generate read data in response to the sensed voltage level of the bit line; and
   a PMOS transistor coupled between the source line and an electrical ground and configured to flow a current from the source line to the electrical ground in the read operation.

2. The electronic device according to claim 1, further comprises:
   a NMOS transistor coupled between the source line and the electrical ground and configured to flow a current from the source line to the electrical ground in a write operation for writing a first data.

3. The electronic device according to claim 1, wherein the semiconductor memory further comprises:
   a write current supply unit configured to supply write current to either the bit line or the source line according to a logic value of data to be written in a write operation.

4. The electronic device according to claim 1, wherein the sense amplifier generates the read data by comparing levels of a voltage of the bit line and a reference voltage.

5. The electronic device according to claim 1, wherein the variable switch element has a high resistance value when the voltage level of the source line is low.

6. The electronic device according to claim 1, further comprising a microprocessor which includes:
   a control unit that is configured to receive a signal including a command from an outside of the microprocessor, and performs extracting, decoding of the command, or controlling input or output of a signal of microprocessor;
   an operation unit configured to perform an operation based on a result that the control unit decodes the command; and
   a memory unit configured to store data for performing the operation, data corresponding to a result of performing the operation, or an address of data for which the operation is performed,
   wherein the semiconductor memory unit is part of the memory unit in the microprocessor.

7. The electronic device according to claim 1, further comprising a memory system which includes:
   a memory configured to store data and conserve stored data regardless of power supply;
   a memory controller configured to control input and output of data to and from the memory according to a command inputted form an outside;
   a buffer memory configured to buffer data exchanged between the memory and the outside; and
   an interface configured to perform communication between at least one of the memory, the memory controller and the buffer memory and the outside,
   wherein the semiconductor memory unit is part of the memory or the buffer memory in the memory system.

* * * * *